(12) United States Patent
Alizadeh et al.

(10) Patent No.: US 11,948,774 B2
(45) Date of Patent: Apr. 2, 2024

(54) GLOW PLASMA GAS MEASUREMENT SIGNAL PROCESSING

(71) Applicant: Servomex Group Limited, Crowborough (GB)

(72) Inventors: Bahram Alizadeh, Crowborough (GB); Martin Lopez, Crowborough (GB)

(73) Assignee: Servomex Group Limited, Crowborough (GB)

(*) Notice: Subject to any disclaimer, the term of this patent is extended or adjusted under 35 U.S.C. 154(b) by 298 days.

(21) Appl. No.: 17/223,941

(22) Filed: Apr. 6, 2021

(65) Prior Publication Data
US 2021/0310956 A1    Oct. 7, 2021

(30) Foreign Application Priority Data

Apr. 6, 2020  (GB) ...................................... 2005079
Apr. 7, 2020  (GB) ...................................... 2005140

(51) Int. Cl.
*H01J 37/32*  (2006.01)
*G01J 3/443*  (2006.01)
(Continued)

(52) U.S. Cl.
CPC ......... *H01J 37/32045* (2013.01); *G01J 3/443* (2013.01); *G01N 21/67* (2013.01);
(Continued)

(58) Field of Classification Search
CPC ......... G01J 3/443; G01N 21/67; G01N 21/68; G01N 21/73; H01J 37/32018;
(Continued)

(56) References Cited

U.S. PATENT DOCUMENTS 6,043,881 A     3/2000   Wegrzyn et al.
8,239,171 B2    8/2012   Gamache et al.
2015/0015881 A1 1/2015   Ikeda

FOREIGN PATENT DOCUMENTS

EP   0 617 274 A1   9/1994
EP   1 381 257 A2   1/2004
(Continued)

OTHER PUBLICATIONS

Great Britain Search and Examination Report dated Aug. 12, 2020 for Great Britain Application No. GB2005079.5; 3 Pages.
(Continued)

*Primary Examiner* — Mark R Gaworecki
(74) *Attorney, Agent, or Firm* — DALY, CROWLEY, MOFFORD & DURKEE, LLP

(57) ABSTRACT

Methods and apparatus for determination of the gas composition of a sample gas using glow discharge optical emission spectroscopy, in which the method comprises: generating one or more oscillating electromagnetic fields within a plasma cell to excite particles within the cell, to produce a glow discharge plasma in the plasma cell, and controlling the operating conditions for the plasma cell while flowing a gas mixture through the plasma cell to maintain glow discharge optical emissions from the plasma within a desired operating range; and monitoring one or more glow discharge optical emissions from the plasma in the plasma cell by measuring the optical emissions, or measuring a signal that correlates with the optical emissions, at twice the plasma excitation frequency; and processing the signal during each excitation cycle of the electromagnetic excitation, to determine the concentration of a gas within a gas mixture flowing through the plasma cell.

49 Claims, 10 Drawing Sheets

(51) Int. Cl.
    *G01N 21/67*      (2006.01)
    *G01N 21/68*      (2006.01)
    *H05H 1/00*      (2006.01)
    *H05H 1/24*      (2006.01)
    *H05H 1/46*      (2006.01)

(52) U.S. Cl.
    CPC ........ *G01N 21/68* (2013.01); *H01J 37/32018* (2013.01); *H01J 37/32449* (2013.01); *H01J 37/32926* (2013.01); *H01J 37/32935* (2013.01); *H01J 37/32981* (2013.01); *H05H 1/0037* (2013.01); *H05H 1/4697* (2021.05); *H01J 37/32568* (2013.01); *H01J 37/32972* (2013.01); *H01J 37/3299* (2013.01); *H01J 2237/334* (2013.01)

(58) Field of Classification Search
    CPC .......... H01J 37/32045; H01J 37/32449; H01J 37/32568; H01J 37/32926; H01J 37/32935; H01J 37/32972; H01J 37/32981; H01J 37/3299; H01J 2237/334; H05H 1/0037; H05H 1/4697; H05H 1/48
See application file for complete search history.

(56) References Cited

FOREIGN PATENT DOCUMENTS

| | | |
|---|---|---|
| EP | 3 265 806 A1 | 1/2018 |
| EP | 3 719 482 A2 | 10/2020 |
| GB | 2 381 375 A | 4/2003 |
| GB | 2583025 A | 10/2020 |
| GB | 2583897 A | 11/2020 |

OTHER PUBLICATIONS

Great Britain Combined Search and Examination Report dated Jun. 9, 2020 for Great Britain Application No. GB2005140.5; 2 Pages.
Extended European Search Report dated Sep. 17, 2021 for European Application No. 21167086.4; 6 Pages.
Canadian Examination Report dated Jan. 25, 2023 for Canadian Application No. 3,114,186; 12 Pages.

GLOW PLASMA GAS MEASUREMENT SIGNAL PROCESSING

CROSS REFERENCE TO RELATED APPLICATIONS

This patent application is entitled to claim priority from UK Patent Application Nos. 2005140.5 and 2005079.5 (published as GB2583025), which are incorporated herein by reference.

FIELD OF INVENTION

This disclosure relates to methods, apparatuses and systems for processing signals derived from glow plasma emissions.

BACKGROUND

Plasma is composed of ionised gas molecules in a mixture of free electrons, neutral molecules and photons of light of various wavelengths. Plasma can take many forms, both naturally occurring, such as in stars, nebulae, flames and lightning, or man-made such as arc discharges in high strength electric fields. Plasmas may occur both at high and low pressures. Reduced pressure plasmas have the advantages of requiring a lower strike voltage (ignition of plasma) and maintenance voltage (voltage to sustain a plasma), as well as decreased incidence of quenching due to lower species density, but there are increased costs and complexity associated with obtaining this lower pressure and the total amount of ionised molecules may be reduced compared to a higher pressure plasma. Plasmas are used in material processing applications such as surface cleaning for the preparation of substrates for thin film depositing. They are also used in plasma lighting, ozone production, etching of computer chips, and manufacture of solar cells.

Within a glow plasma, electrons and other ionised species are not in thermal equilibrium, and the energy associated with the excited within the electric field may be well above that of the average energy for the mixture. The species electric field and inelastic collisions between the accelerated electrons and gas molecules lead to the creation of excited and ionised species. The subsequent radiative decay to lower energy levels results in the emission of characteristic photons of radiation that gives the name of "glow" discharge. Glow discharges may take place in either direct current (DC) or alternating current (AC) excitation fields. DC fields involve direct electrode contact within the gaseous environment, which may be undesirable for the properties and lifetime of the electrode. AC fields can be coupled to the gaseous sample via a dielectric barrier, thus the electrodes are shielded from direct contact with the gas. Dielectric barrier discharge (DBD) plasmas have also been used in industrial ozone production.

Glow plasmas have an important application in gas analysis. Optical Emission Spectroscopy (OES) is a technique for species identification and quantification, where light emission from excited state species within a glow plasma is analysed. The location of the emission lines in the electromagnetic spectrum indicates the identity of the species and the intensity denotes the concentration of that gas species in the gas mixture (as shown in FIG. 1). Although glow discharge optical emission spectroscopy (GD-OES) has been used in the analysis of surfaces of solid, conducting materials, it has not been the preferred technology for gas analysis. Most conventional GD-OES systems use a low-pressure glow discharge plasma, but measurements at atmospheric pressure or higher may still be possible on some instances. In gas analysis, glow plasmas may be used to analyse a wide variety of gases including pollutants, and the analysis may be used to control an industrial process to minimise emission levels and gases of interest to optimise process efficiency, reducing power demand and ultimately reducing production of greenhouse gases, which is part of most power production and heat production.

SUMMARY

Provided are methods, apparatuses and systems for processing optical signals from stabilised glow plasmas in real time with enhanced signal to noise recovery.

In one aspect of the invention, there is provided a method for generating a stable plasma comprising: generating one or more oscillating electromagnetic fields within a plasma cell to excite particles within the cell, to produce a glow discharge plasma in the plasma cell, and controlling the operating conditions for the plasma cell while flowing a gas mixture through the plasma cell to maintain glow discharge optical emissions from the plasma within a desired operating range; and monitoring one or more glow discharge optical emissions from the plasma in the plasma cell; wherein said monitoring of the optical emissions comprises measuring the optical emissions, or measuring a signal that correlates with the optical emissions, at twice the plasma excitation frequency; and processing the signal during each excitation cycle of the electromagnetic excitation, to determine the concentration of a gas within a gas mixture flowing through the plasma cell.

The step of generating one or more oscillating electromagnetic fields may comprise generating an oscillating electric field or an oscillating magnetic field or a combination of both oscillating electric and magnetic fields within a plasma cell, to excite particles (atoms, molecules or charged species) within the cell, to produce a glow discharge from a plasma in the plasma cell. According to the some of the methods, apparatus and systems described in this specification, relatively stable glow discharge optical emissions can be maintained from a plasma in a plasma cell, via monitoring one or more glow discharge optical emissions or one or more signals that correlate with the optical emissions, and providing dynamic resonant feedback control of operating conditions such as the electric or magnetic field that is used to excite particles within the plasma cell. Emissions from the stabilised glow plasma can then be used in glow discharge optical emission spectroscopy (GD-OES) and non-optical analysis, for gas analysis and in other applications.

The monitoring of one or more glow discharge optical emissions from the plasma in the plasma cell may be performed in real time during each excitation cycle, and the methods and apparatus described herein provide improved signal to noise recovery. The monitoring of the optical signal is at twice the excitation frequency of the plasma. Monitoring the signal at twice the excitation frequency (2f) results in signal to noise ratio improvements, due to the narrowing of the frequency bandwidth of the signal and separation in frequency from the excitation frequency (f), for example by using a notch filter. Signal detection techniques to examine and determine the 2f signal may include one or more of the following: Lock-in detection, synchronous detection, frequency domain analysis such as by using Fast Fourier Transforms (FFTs) and time or frequency domain matched filter techniques, shape filters or other appropriate detection means. The signal may be taken as the peak heights, the peak areas, as integrals of the 2f signal or any other appropriate technique with suitable filtering (e.g. median filter) and/or ensemble averaging and/or moving averaging. The inventors' recognition of the desirability of measuring the signal in real time throughout the monitoring process influenced the inventors' design and implementation of the optical detection system. For example, silicon detectors for ultraviolet or visible light are an economical and efficient means of measuring the light, but the inventors determined that a rapid response time was desirable and selected detectors with intrinsically low capacitance. The signal collection could be achieved after passing through the transmission band of an optical filter or by using a dispersive grating or other appropriate wavelength selection device.

Many conventional glow plasma discharges use a Royer transformer in a self-oscillating scheme to maintain a stable plasma. This enables a controlled glow plasma to be maintained over a narrow range of conditions. Various techniques have been used to improve the stability and flexibility of conventional glow plasmas, including using inductive feedback techniques (EP1381257A2). One contemporary innovation is the use of secondary stabilisation electrodes (EP3265806A1) to apply a transverse electric field and/or to provide electron-injection.

Another more recent example method, described in UK Patent Application Publication No. GB2583897, maintains a stable glow discharge plasma in a plasma cell by applying an input signal to two or more electrodes in the plasma cell to generate a voltage gradient between the electrodes, measuring an induced signal across the plasma cell, and comparing the induced signal with a reference signal to obtain a difference signal. This comparison is performed at plasma resonance. References to 'resonance' and 'resonant conditions' herein are, as explained below, not to be interpreted as a limitation to peak resonance unless this is stated explicitly. A control signal is then applied to the at least two electrodes in the plasma cell based on the obtained difference signal to achieve a desired voltage gradient for the excitation that is needed for a stable glow under resonance conditions. This method is all achieved in real time during each excitation cycle. The inventors of the present invention have improved upon and extended the teaching of GB2583897 and known GD-OES and other plasma emission systems, by monitoring the output signal at twice the excitation frequency (2f instead of f). This provides signal to noise ratio improvements.

The drive frequency may be scanned or chirped across a defined frequency range either on a regular or variable basis and the plasma excitation frequency may be actively adapted to coincide with the peak resonance related to a species mixture to be analysed, or a phase locked loop circuit may be used to indicate the change in phase or resonant frequency of a self-oscillating plasma system.

BRIEF DESCRIPTION OF DRAWINGS

Various features of exemplary apparatus, systems and methods are described below, by way of example only, with reference to the accompanying drawings in which.

DETAILED DESCRIPTION

Since a plasma is an ionised gas that is electrically conductive, it is able to interact with external electric and magnetic fields. The major constituents of a plasma are free neutral atoms or molecules, positively charged ions or metastable species, free electrons and a variety of energetic photons. These species are in a state of constant collisions. The degree of ionisation in a plasma is the ratio of number density of charged species to the neutral species.

There are three main light production processes in a plasma described as follows:

i. Free-Bound Transitions or Recombination Radiation:

A free electron in a plasma can also be captured by an ion; also known as radiative recombination. If this capture or recombination is to the ground state, a photon with an energy greater than the ionisation potential of the ion or atom is emitted, producing a continuous spectrum. Alternatively, if the recombination is to an excited energy level, the electron cascades down through the excited states to the ground state by releasing photons of unique wavelengths, thus producing the emission lines characteristic of that ion species.

ii. Bound-Bound Transitions

These transitions happen when a change to the energy of an electron within an atom or a molecule is such that the electron remains attached or bound to the atom or molecule both before and after the change. In the case where energy is increased, typically a photon roaming the plasma is absorbed. When the energy is reduced, a photon is emitted. Bound-bound transitions in a plasma can produce both emission and absorption lines unique to the atomic or molecular species.

iii. Free-Free Transitions: Bremsstrahlung

In any plasma there are many unbound electrons which can freely interact with other species. When a free electron in a plasma passes close to an ionised atom or molecule, it is either accelerated or decelerated. This results in a net change of the kinetic energy of that electron. Quantum mechanics dictates that this change of energy is quantised and mediated by either absorbing or emitting a photon by the electron. Since these photons can be of any wavelength, radiation produced in this process has a continuous spectrum and is also known as thermal bremsstrahlung.

Within a plasma itself several processes occur that enable the above transitions, with the most important process being collisions among species. An important set of collisions is those between the electrons/charged species and neutrals, which leads to ionisation. For this to happen, a fraction of the electrons or charged species need to have kinetic energies exceeding the ionisation potential of the gas of interest. Conversely, collisions can also lead to the recombination process, where the impact between the charged species of opposite polarity can lead to the production of neutral species.

Figure 1A:
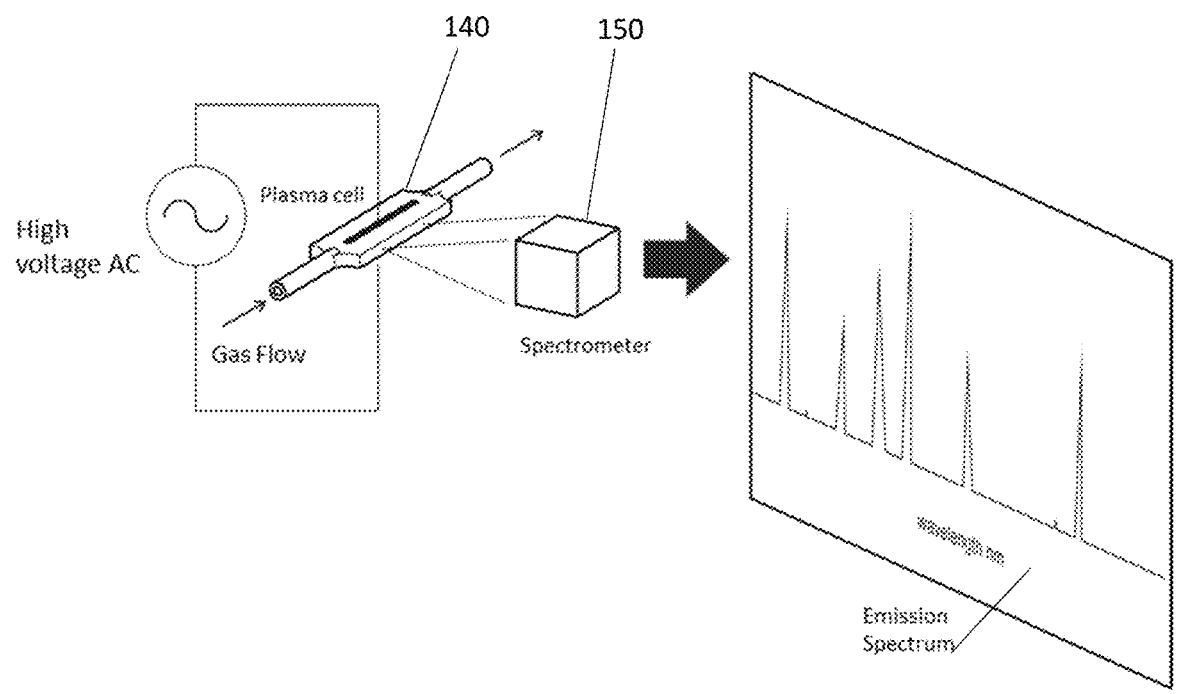
FIG. 1A is a schematic representation of components of an optical emission spectroscopy system, which can use a spectrometer and light emitted by dielectric barrier discharge (DBD) in a plasma cell, for gas analysis.
Figure 1B:
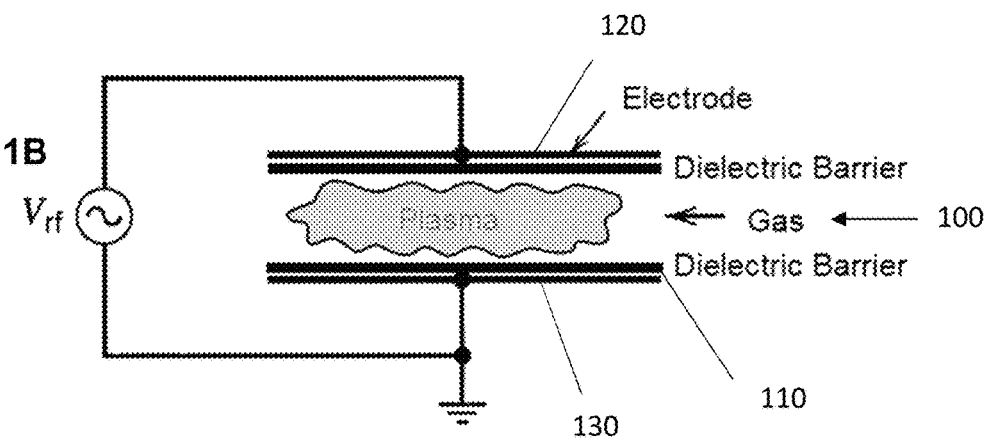
FIG. 1B is an illustration of a glow plasma.

One method of producing a glow plasma is by means of high voltage radio frequency (RF) excitation of a gas 100 flowing in a dielectric barrier vessel 110 (for example glass or quartz) surrounded by conductive electrodes 120, 130 to form a plasma cell 140, as shown schematically in FIGS. 1A and 1B. In each RF excitation cycle, charged species in a plasma experience peak acceleration in opposite directions in the electric field twice. On the positive side of the sinewave excitation, this acceleration peaks near the top of the waveform. Similarly, on the negative side of the sinewave excitation, the charged species experience peak acceleration in the opposite polarity near the trough of the waveform. Since all three light production processes described above will also peak during these high acceleration events, the instantaneous light produced from any glow plasma will exhibit two distinct peaks and troughs during each individual cycle of RF excitation, and the emission spectrum 160 that is characteristic of the constituent gases can be measured using a spectrometer or other detectors 150.

Figure 2:
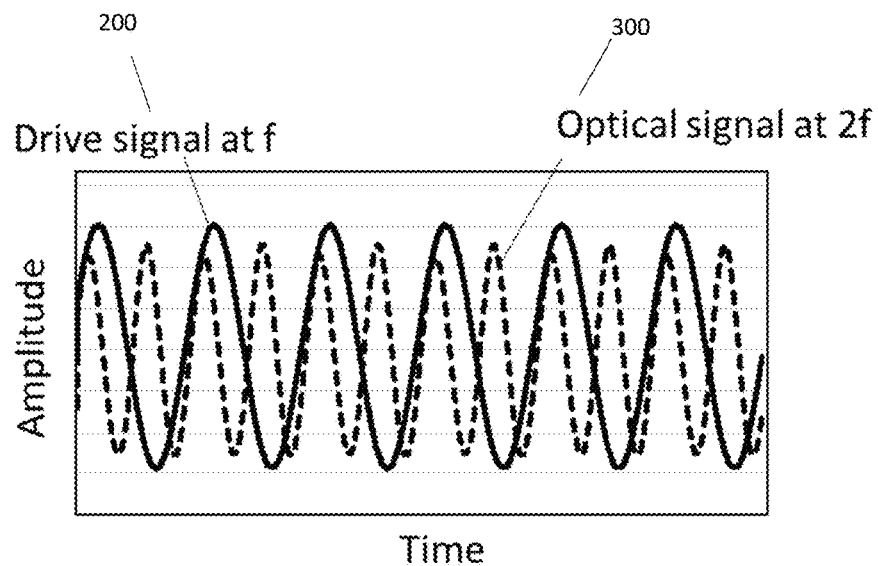
FIG. 2 is an illustration of the excitation waveform and 2f optical waveform.

This has been experimentally verified by the inventors using a high-speed photodiode amplifier circuit detecting the instantaneous light signal through a narrow optical bandpass filter centred around 337 nm in a $N_2$ glow plasma. This is clearly illustrated in FIG. 2, where the excitation signal 200 is at frequency f and the detected signal 300 is at twice the excitation frequency (2f). Note that there is a phase shift between the excitation and drive waveforms due to instrumentation, plasma species inertia and other factors.

Until relatively recently, the accurate acquisition and processing of these signals would have been extremely difficult to accomplish in real time. There are also specific design recommendations to make the detectors sufficiently fast to respond at the drive frequencies which are typically used (tens of kHz or higher), which are not generally required or used in standard optical plasma measurements. This is the reason why many plasma gas detectors use an integrated or DC signal as the processed detection signal. It is also one of the main reasons why the non-intuitive approach proposed by the inventors has not been considered previously.

The inventors' recognition that the emitted light from a plasma has a $2^{nd}$ harmonic (2f) component correlated to the plasma RF excitation waveform allows it to be extracted from noisy backgrounds with extremely high noise rejection. One conventional methodology to achieve this is called Lock-in detection. The key strength of a Lock-in detector is its ability to extract a signal amplitude and phase in very noisy environments. In effect, Lock-in detection is like a Fourier Transform with a single frequency (2f) component, with all other coefficients being set to zero. Typically, it uses a homodyne detection scheme followed by low-pass filtering to extract a desired signal amplitude and phase relative to a periodic reference (see FIG. 4). The shape of the 2f periodic reference waveform could take many forms including sinusoidal, square wave or other appropriate shape to optimally extract the desired process signal. This detection occurs in a well-defined narrow frequency band around the reference frequency, efficiently rejecting all other frequency contributions from other spurious sources. Using this technique allows the photodiode or other appropriate detection means (e.g. photomultiplier, bolometer, pyroelectric or thermopile detector) detection of plasma light at an extremely narrow bandwidth leading to significantly lower thermal and shot noise contribution from the amplifiers. The magnitude of improvement that can be achieved by using the Lock-in technique can be seen in FIG. 5 for simulated data. Graph (a) shows the clean 2f signal, whilst (b) shows the effect of adding large scale random noise to the signal. Even with such large noise, Lock-in detection is capable of recovering the original signal effectively as can be seen in graph (c). In practice, a silicon photodiode is both an economical and versatile solution, with potentially fast detection across a broad range of ultraviolet, visible and near infrared wavelengths. Another important consideration is the presence of ambient light. Most light detection from a glow plasma occurs in the near ultraviolet and visible band of wavelengths. This is also the band of wavelengths where significant spurious ambient light sources exist. The $2^{nd}$ harmonic detection of plasma light gives an enhanced rejection of ambient sources, which will be generally modulating at a much lower frequency, making the task of light shielding of a plasma detector significantly easier. Whether in a driven or self-oscillating system, the plasma excitation drive is optimally free from 2f components and/or distortions which might contain 2f components, since this could contribute to spurious 2f noise and/or offsets.

Figure 4:
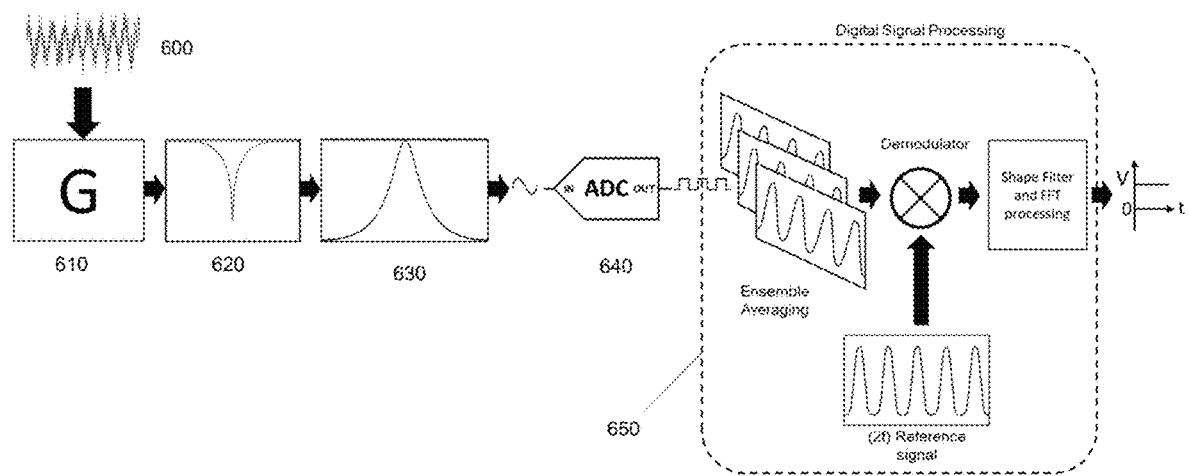
FIG. 4 is an illustration of a 2f signal processing technique.
Figure 5:
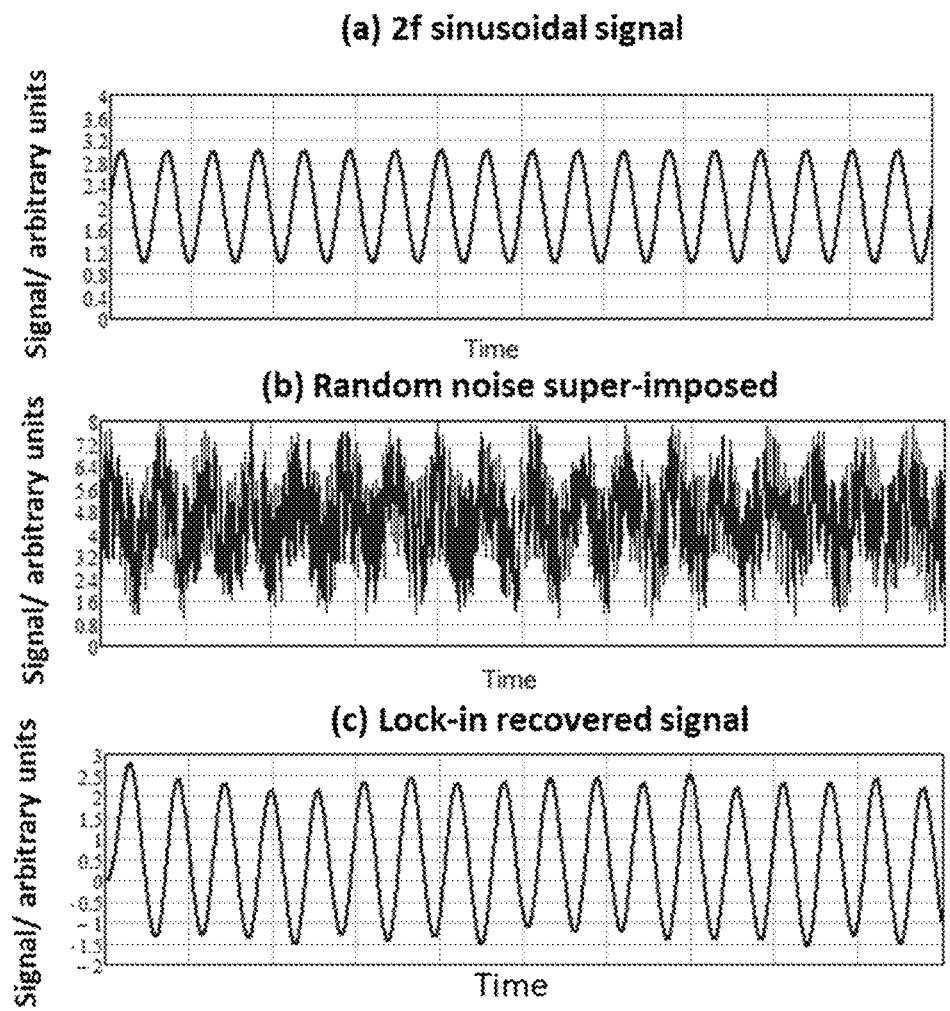
FIGS. 5(a), 5(b) and 5(c) are an illustration of the benefits of using lock-in detection.

If a glow plasma spectroscopic instrument is to be used for measuring trace levels of a gas species, it must be capable of achieving two important signal processing objectives at the same time. Firstly, a significantly higher gain is required to make the weak emission detectable. Secondly, a much higher resolution digitiser is needed to provide measurement resolution. Post processing of the 2f signal is extremely important in the case of a weakly emitting component. The $2^{nd}$ harmonic signal may be processed in two ways such as in a conventional design by means of analogue Lock-in detection using multipliers and low-pass filters. These analogue circuits are prone to drift, however, and come with the hefty penalty of additional noise contribution. Alternatively, in a modern electronic architecture, the $2^{nd}$ harmonic signal will be digitised directly in a fast low-noise Analogue to Digital Converter (ADC). All processing is then performed digitally from here onwards to limit noise contribution. In order to cover a wide range of gas concentrations over all the possible range of intensity transmissions encountered in industrial applications, preferably a 16-bit or higher resolution ADC is used. The $2^{nd}$ harmonic signal itself may treated as a digital frame or a scan. A high-speed time critical real-time data acquisition algorithm using a micro-processor performs all the digital Lock-in tasks including the front-end frame averaging, multiplication by a reference 2f frame, optionally followed by a shape recovery algorithm such as using FFT techniques to optimise computational efficiency. In practice, a weak 2f signal may be corrupted by a mix of random and systematic distortions, therefore, shape discrimination of the weak profiles may play a useful role in the signal recovery. Experiments during the feasibility work with various configurations showed that a unique blend of high-gain AC-coupled analogue front end followed by high-speed digital signal processing can be a good combination to successfully recover weak signals. An illustration of a 2f signal processing technique is shown in FIG. 4. The excitation waveform is typically sinusoidal in shape, which may be convenient, especially if Lock-in or FFT techniques are performed. However, other profiles may be used and instrumentation and/or other factors may distort the excitation profile, and this may be significant in any post processing, especially with regard to any shape or matched filter usage. The phase angle and/or signal at frequencies other than 2f also contain signal enhancement information or background compositional data and can be used to extract extra signal processing information. For example, a change in the phase angle may be related to the target gas concentration within a mixture and/or related to background mixture composition for non-binary gas mixtures.

In summary, light detection at 2f is superior to conventional photodiode light detection at DC due to the following advantages:
 1. Improved signal to noise ratio.
 2. Detection at an extremely narrow bandwidth leading to lower thermal and Shot noise.
 3. Enhanced rejection of spurious sources of light such as ambient light.

However, detection of light at 2f in real time at high frequencies 600 has the following new design recommendations for optimal performance, as illustrated in FIG. 4:
 1. A photodiode gain stage 610 with DC cancellation, comprising
    Low capacitance and high shunt resistance of the photodiode element.
    Techniques to lower junction capacitance such as reverse biasing of photodiode.
    High speed trans-impedance amplifier.
    Active cancellation of DC light signal, since without this high gain amplification is not possible.
 2. Active suppression of 1f signal (e.g. via a notch filter 620), since without this high gain amplification 630 is not possible.
 3. Fast analogue to digital conversion 640 (e.g. >10 times oversampling of the 2f signal).
 4. Demodulation and Lock-in detection followed by filtering performed in digital domain 650 to avoid additional noise contribution from analogue circuits.

Detailed Embodiments and Results

An example apparatus, described in detail below, uses glow discharge optical emission spectroscopy in gas analysis, although this method herein described for signal processing will also have processing enhancements for any other oscillating drive glow plasma formats. This example (as per UK Patent Application Publication No. GB2583897) uses improved glow plasma stability at atmospheric pressure, for in-line gas analysis. This example could also be accomplished, for example, using a Royer transformer and/or secondary stabilising electrodes to apply a transverse electric field or to provide electron-injection, but the former would have a narrower operating range and the latter would involve extra build and operational complexity. Also, in the case of electron injection, the presence of such secondary electrodes within the gas stream would expose them to potential contamination and corrosion. As the gas of interest is carried into the plasma, it is excited, and the light emitted by the radiative decay is detected by a spectrometer for its unique wavelength signature. OES offers a non-intrusive and very specific information not only on plasma chemistry, but also on the relative concentration of the species. Unlike conventional GD-OES systems, gas analysis applications often require that the gas stream itself does not come into physical contact with the high voltage electrodes to avoid any sputtering effects or chemical reactions on the electrodes. In many gas analysis applications, the gas of interest is in a continuous flow regime which requires a fast response for spectroscopic detection and species identification.

The present example addresses the plasma stability shortcomings of previous methods at the fundamental plasma energy level, to enable stable glow plasma under a very wide range of conditions (e.g. composition, types of gases, concentrations of gases and flow rates). This is achieved via control of the plasma working conditions. In an example, this control is achieved through cycle-by-cycle monitoring of the plasma current (i.e. during each excitation cycle) and using feedback control to maintain the plasma current at a defined value. This feedback may be achieved by several methods such as by control of the voltage gradient across the plasma cell in real time.

References in this patent specification to "resonance" or "resonant conditions" or "resonant frequency" are intended to refer to the functional excitation frequency range (resonant frequency band) for a glow plasma which will be dependent on the gas composition and physical dimensions of the plasma cell, amongst other considerations, such as ambient conditions. Within this range, a glow plasma can be actively maintained, but there will typically be an optimum frequency or peak resonance frequency within the functional glow plasma excitation frequency range, where maximum energy transfer efficiency to the plasma occurs (maximum or peak resonance). For a fixed frequency, the voltage gradient across the plasma cell may be adapted through a feedback mechanism to maintain a stable glow plasma with changing gas composition and/or ambient conditions. Alternatively, for a fixed gas composition and/or ambient conditions, the frequency may be scanned to find the optimum (maximum) resonance peak, or a combination of the two methods may be implemented. The impedance between the electrical excitation source and the plasma cell should be optimised to achieve both stabilisation and optimum energy transfer. The optimisation parameters may be determined theoretically, empirically or a combination of both.

There is a compositionally dependent, resonant voltage gradient across the plasma cell that will maintain a glow plasma, and this can be achieved electrically by adjusting the voltage applied to the electrodes. For example, if a defined and/or fixed plasma current profile is maintained by using a feedback circuit or other appropriate means to actively adjust the voltage applied to the electrodes in real time (cycle to cycle), the glow plasma may be stabilised and maintained over a wide range of compositional and ambient conditions. The feedback circuit used is one that is able to cope with high speed feedback implementation.

The input excitation waveform shape may be adjusted, for example, to a sine wave, square wave, saw tooth, a smooth, non-sinusoidal function or other appropriate waveform or combinations of waveforms. However, in most practical, high frequency, electrical implementations, the waveform delivered across the plasma may become pseudo-sinusoidal in form.

In one example apparatus, the plasma cell is driven by at least one pair of electrodes, which are separated by a defined distance, through dielectric barriers such as ceramic, glass or quartz on opposite sides of the cell and the gap of the interior of the plasma cell, which forms a channel though which the gas of interest flows and within which the plasma is formed. At least one inlet and at least one outlet are provided to allow entrance and exit of the gas of interest. The electrodes are typically connected to the dielectric barrier by mechanical and/or adhesive means. More than one pair of electrodes may be desirable, for example, if an extended region of glow plasma is required. The size and shape of the electrodes are important in some example applications, since they define the plasma region extension and shape. An extended electrode or multiple electrodes may be useful for multi-species detection, allowing positioning of multiple wavelength selection devices and multiple optical detectors. The geometric configuration of a single pair of electrodes may be convenient for simplicity of design and manufacture, but similar 2f implementations with more than one pair of electrodes may be envisaged, for example, with a second pair of electrodes being present orthogonal to the first pair and/or in series longitudinally and/or coaxially for simultaneous and/or consecutive electromagnetic excitations.

Example electrodes are provided with defined discontinuities in the electrode construction, such as in a mesh or lattice-like construction with round, square or other defined shape gaps. Nevertheless, electrodes with continuous surface construction may be used and are easier to design and assemble and will have higher capacitance for the same external size. A lattice-like electrode construction can lower the high current densities associated with filamentary formation and may also allow the use of optical detectors behind the electrodes measuring light through the holes in the electrodes. Identical, planar, continuous, circular electrodes may advantageously be used, due to the symmetry giving no intrinsic bias to encourage localisation of any plasma instability (breakdown). However, other shapes are possible and potentially advantageous, in particular mechanical and flow configurations.

Thanks to the enhanced stability that is achievable using methods and apparatus described herein, a wider range of electrode designs can be practically implemented. Likewise, the electrodes' shapes can be chosen to modify the profile of the plasma region formed and this may be useful to optimise the plasma geometry for particular flow regimes and/or optical emission or collection designs.

The area of the electrodes will affect the plasma cross sectional area and hence the amount of light emitted, with a larger area increasing the emitted light accordingly, although this will be at the expense of higher input power. Additionally, larger surface area electrodes will increase the capacitance of the system and this will enable enhanced current feedback and hence increased performance. Ideally, the electrical and mechanical properties of the dielectric and hence also the impedance and capacitive properties of the dielectric barriers are stable with time for optimal operational stability. In addition, the material and electrical properties of the dielectric are relevant factors when deciding the optimal thickness of the dielectric barriers. If the dielectric barriers are too thin, the current limiting properties may be insufficient, and if the barriers are too thick, an increased voltage will be required to penetrate the barrier. The voltage gradient across the gap is a control factor when inducing the plasma initiation and maintenance. For a fixed voltage, the smaller the gap, the larger will be the voltage gradient. This means that a small gap will enable the use of a lower voltage to induce a plasma in comparison with a large gap to induce the same voltage gradient. This is a consideration when attempting to initiate plasma in high ionisation energy gases such as nitrogen. A lower voltage can also have advantages for electrical safety design, easier transformer build requirement (fewer turns) and lower power usage. Additionally, a small gap will create a larger capacitance, which will enable more sensitive current feedback and enhance sensitivity, especially in non-optical detection mode. There is a practical limit to the size of the gap used because, as the gap becomes smaller, there will be a larger pressure drop across the cell and the optical output may become very low. A compromise gap size is therefore used, which takes account of the above-mentioned factors, as well as manufacturability and cost. In some examples, insulation is provided around the electrodes (encapsulation) to avoid corona discharge formation.

In order to monitor the optical output, at least one optically transmissive element must be present in the cell, transparent to the wavelength range of the light of interest (typically in the ultraviolet and visible parts of the electromagnetic spectrum). The at least one optically transmissive element may include one or more of the following: windows, lenses, diffraction gratings, optical filters or spectrometers. These optical elements should be photo-stable to ultraviolet and visible light and also not luminesce in the wavelength range of interest as a consequence of photon absorption. Optical fibres may be useful in transferring the optical output to a non-line-of-sight destination and/or from a hot region containing the plasma cell to a cooler region where the electronics can operate within their operational ambient temperature limits. Additionally, fibre optics allow the siting of the detector(s) and/or signal processing electronics at a distance away from the plasma cell and the high associated electromagnetic fields.

For gas detection, the output light may be detected by one or more detectors 150 such as photodetectors (e.g. silicon or InGaAs photodiodes), or thermal based detectors (e.g. pyroelectric detectors, bolometers or thermopiles) or, alternatively, the output light may be collected by a spectrometer, which creates a spectral plot across an emission wavelength range. The changes of intensities of emission lines with gas composition may be used for speciation and quantification. Plasma by-products are present in the exhaust from the cell 140. These may be useful for plasma surface etching, cleaning, chemical production or other purposes. The by-products may also contain hazardous gaseous species, which may require appropriate treatment or consideration. The amount of plasma by-products produced and present in the exiting gas will be dependent on the gas composition, pressure, flow rate, cell size and electrode area amongst other factors.

All materials used to hold or encapsulate the plasma cell should be photostable to ultraviolet and visible light and also not luminescence within the wavelength range of interest as a consequence of photon absorption. Additionally, electromagnetic shielding may be useful to shield or contain the plasma cell and/or associated electronics from internal or external sources of electromagnetic interferences. Although the device has been described advantageously as being able to function at atmospheric pressure or higher, it may be desirable, in some circumstances, to operate at sub-atmospheric pressures, for example, to lower the required initiation and maintenance voltage and/or operational power or to lower the density of harmful by-products.

In some embodiments, the plasma cell may be maintained at a defined, fixed temperature. This may prevent condensation and enhance plasma stability. In addition, the gas sample entering the cell may be maintained at a defined, fixed temperature. This has the advantages of increasing the thermal stability of the gas entering the cell, hence stabilising the output and lowering the voltage required to strike and maintain the plasma through the decrease in density, when held at higher than ambient temperature and with the addition of thermal energy to the gas sample. However, both of these options involve increased power for the heating. For optimal stability, the flow rate through the plasma cell should also be maintained at a defined, fixed flow rate through suitable flow control means, such as a flow controller.

Embodiments may also be designed to add one or more dopants to the gas sample prior to plasma entry. For example, trace amounts of water may be added for signal processing reasons, as described in U.S. Pat. No. 8,239,171.

A dielectric barrier discharge (DBD) is a form of discharge in which both electrodes of the at least one pair are in contact with a dielectric material. This dielectric layer acts as a current limiter. Under certain conditions, a unique type of discharge mode in DBDs is present, where the discharge appears as a diffuse glow, covering the entire electrode surface uniformly. Gas pre-ionisation by electrons and metastable species from previous discharges and the interaction between the plasma and the dielectric surfaces play important roles in the formation of this glow mode. The shape, size and separation of the electrodes, as well as the properties and thickness of any dielectric barrier between the electrodes and the plasma will be influential in determining the optimal plasma field in glow discharge mode. Although, in principle, the electrodes could be in direct contact with the gas to be measured, in practice, a first example has electrodes protected by a dielectric barrier (e.g. glass or ceramic or any dielectric that can withstand high temperatures and high electromagnetic fields). Additionally, depending on the gases to be measured, there may be aggressive, corrosive components present (e.g. free radicals, ionised molecules and/or chemically corrosive gases/by-products) and, therefore, the dielectric surface must be corrosion resistant in these circumstances. The use of a dielectric barrier, however, precludes the use of a high voltage DC field.

The use of an AC field means that the waveform, frequency and amplitude are important parameters for the stability of any glow plasma to be achieved. When the plasma is used for gas analysis, the signal generated by the plasma when the measurand(s) is (are) present may be determined by, for example, optical detection (for example with a passband filter (wavelength selection) and optical (silicon) detector), which may be in the ultraviolet and/or visible light spectrum. The intensity of emitted light at an individual passband is indicative of the measurand speciation and concentration. This requirement means that there must be, in this optical range, at least one transparent window or other optical element within the plasma gas cell for this type of gas detection.

A typical electrical characteristic of a DBD plasma at atmospheric pressure can be described as follows. Applying an external AC high voltage to the electrodes causes the discharge to initiate when the voltage across the gas gap rises above the breakdown voltage. The breakdown of the gas in the gap causes a plasma to be formed and the electrode current rises rapidly. In many conventional DBDs, this uncontrolled rise in plasma current can lead to the formation of filamentary discharges in this phase. This is characterised by a fast change in filamentary channel resistance, as a rapidly growing space charge forms a self-propagating streamer. Charged particles produced in the plasma accumulate on the dielectric surfaces adjacent to the electrodes, creating an electric field opposing the applied field. This causes a decrease in the net electric field across the gap and, therefore, the current diminishes rapidly. The charges remaining on the dielectric surfaces after the discharge ends, produce a residual electric field ready for the next cycle of the field.

In optical emission spectroscopy, the presence of filamentary discharges during each half cycle leads to undesirably noisy signals at the detector. The filamentary discharges will also, over long time periods, erode the surface of the dielectric barrier, such as quartz, leading to measurement drift and ultimate failure of the barrier. It is therefore desirable to operate the DBD plasma in a stable diffuse glow mode to achieve low noise and low drift.

The plasma current waveform provides a means of detecting the presence of the filamentary discharges during each half cycle. Therefore, by implementing control of the plasma current, it is possible to control or mitigate the formation of undesirable filaments. Such a control is on a cycle-by-cycle basis with a reasonably high bandwidth. Another important parameter of the DBD plasma operation, according to one example, is the frequency of its RF excitation. When the excitation frequency is too low, electrons and charged species on the dielectric surfaces accumulate too quickly and the opposing electric field overly suppresses the rise of the plasma voltage. Additionally, some recombination of species on the boundary surface takes place. These effects, together, will result in either non-initiation or premature quenching of the plasma. Conversely, with too high excitation frequency, the electrons and charged species generated in the plasma bulk become confined within the inter-electrode gap and cannot reach the barrier surface to form the necessary opposing electric field. This will also lead to an unstable atmospheric DBD plasma. The solution is to control the excitation frequency to remain within the optimum (relatively narrow) frequency range over which the plasma is in a stable glow operation. This is referred to herein as the resonant frequency band of the feedback system.

Resonant Current Feedback Control Circuit

Described below is an example resonant feedback control circuit that, during each cycle of an alternating excitation voltage, is able to actively adjust a voltage applied to electrodes on a cycle-by-cycle basis thereby controlling the plasma current and/or the excitation frequency, for example.

Figure 3:
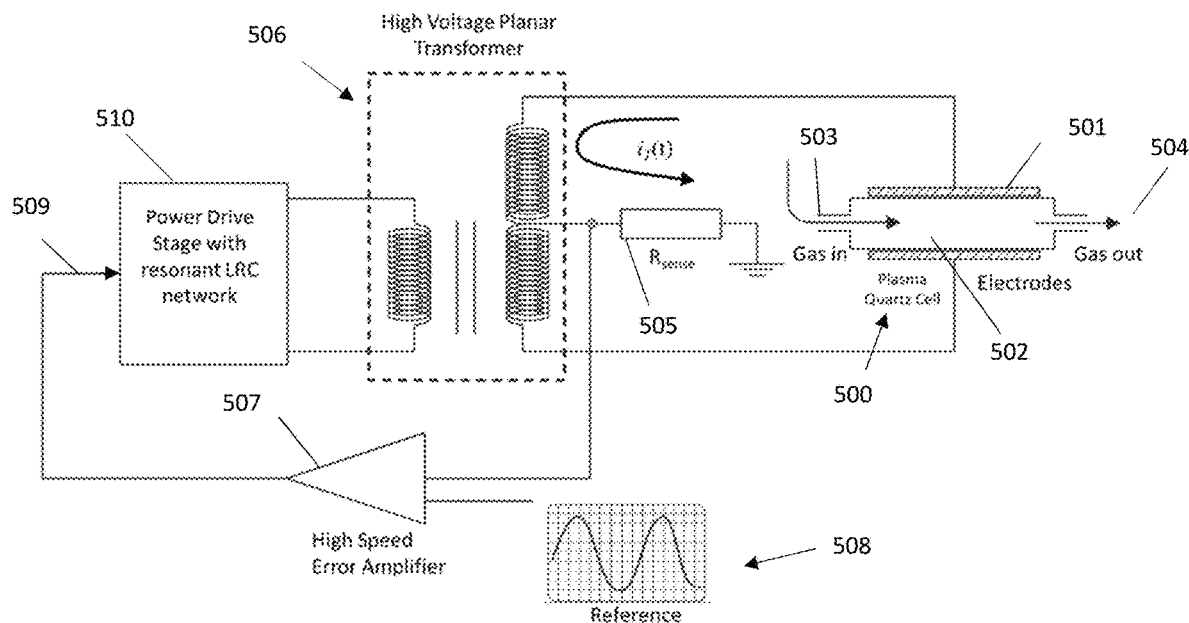
FIG. 3 is a schematic representation of components of a resonant current feedback control system for a plasma cell.

FIG. 3 illustrates an example implementation of the basic elements of a feedback circuit for plasma current control.

Plasma cell 500 allows formation of a plasma. The plasma cell is driven by at least one pair of electrodes 501 which are separated by a defined distance. Electrodes 501 are typically connected to a dielectric barrier (not shown) by mechanical and/or adhesive means. The distance provided between electrodes 501 forms a gap 502 in the interior of the plasma cell 500, where gap 502 in combination with gas inlet aperture 503 and gas outlet aperture 504 form a channel through which a gas of interest flow is able to flow through the plasma cell 500. A plasma is formed within gap 502 of the plasma cell 500.

A sense resistor 505 is provided as part of the feedback circuit to measure a signal across plasma cell 500 when electrodes 501 are provided with an alternating excitation voltage and a voltage gradient between electrodes 501 is generated. Sense resistor 505 is arranged to measure the signal induced across the plasma cell and an instantaneous plasma current iT(t) flows through sense resistor 505 and produces a sense voltage $V_s$ which is measured by a meter. Sense resistor 505 is connected to a secondary winding or coil of a high voltage transformer 506 at a point substantially halfway along the secondary winding or coil of the transformer 506 (centre-tap), allowing sense resistor 505 to be ground-referenced. A planar transformer is illustrated but transformer 506 is not limited to this. Transformer 506 is preferably a transformer with low winding capacitance and is discussed in greater detail below.

A connection between an amplifier 507 and sense resistor 505 is provided so that amplifier 507 receives the sense voltage $V_s$ signal from sense resistor 505 via a first amplifier input. A second amplifier input is provided to amplifier 507 so that amplifier 507 is able to receive a reference waveform 508 which can be used to set both the amplitude and frequency of a plasma current. The reference waveform may be provided by a function generator, for example. A sinusoidal reference waveform is illustrated but other waveform profiles could be utilised such as a square wave, saw tooth, triangle or any other appropriate waveform or combinations of waveform.

Amplifier 507 is preferably a high speed amplifier capable of producing an error signal 509 which is proportional to a difference between reference waveform 508 and the actual plasma cell waveform detected by sense resistor 505.

Amplifier 507 provides error signal 509 to a power drive stage, or control unit, that has a resonant LCR network 510 that is used to drive a primary winding or coil of transformer 506.

The error signal drives the base of a complimentary high power NPN-PNP transistor push-pull configuration which in turn drives the primary side of the transformer through a fixed LCR network. The tight magnetic coupling between the secondary and primary windings of the planar transformer transfers this RF energy on a cycle-by-cycle basis to the secondary side which is in turn coupled directly to the plasma electrodes. Operating the whole system in resonance ensures that energy is transferred efficiently to the plasma capacitance at each drive cycle.

The arrangement of FIG. 3 is only one implementation of a resonant current feedback control circuit, and other implementations could be used. As discussed, a planar transformer is not required but it can provide additional benefits that are discussed in greater detail below. There is no need for any high-voltage isolation circuitry for plasma current sensing, since any isolation circuit will adversely affect the bandwidth of such a comparison and will make it too slow to detect the onset of filament formation. The feedback circuit used is one that is able to cope with high speed feedback implementation.

According to the present feedback control circuit, a plasma current can be directly compared to a known reference waveform which can be used to control, or set, the amplitude and/or the frequency of the plasma current.

An alternating excitation voltage applied to electrodes 501 is adjusted, with reference to the reference waveform, on a cycle-by-cycle basis i.e. adjustment occurs based on a difference between a sense voltage $V_s$ measured from the plasma cell and the reference waveform during each cycle of the excitation voltage. Active adjustment of the voltage applied to electrodes 501 on a cycle-by-cycle basis is realised and the glow plasma may be stabilised over a wide range of changing conditions such as gas composition and/or ambient conditions. Adjustment of the voltage applied to electrodes 501 can compensate for the changing conditions so that the plasma can be stabilised during each cycle of the alternating excitation voltage i.e. in real time.

For example, on a cycle-by-cycle basis an excitation frequency of the excitation voltage can be measured and increased to avoid non-initiation or premature quenching of the plasma. Alternatively, the excitation frequency could be decreased to prevent confinement of electrons and charged species within the electrode gap, thereby allowing them to reach the dielectric barrier surface and form an opposing electric field. In other words, the excitation frequency can be controlled to remain within the optimum (relatively narrow) frequency range over which a plasma is in a stable glow operation.

As was mentioned earlier, and as illustrated in FIG. 4, in order to achieve the required fast time response of the detection system, intrinsically low capacitance, high shunt resistance silicon photodiodes (i.e. low active silicon area) were used either singly or in an array with wavelength selection achieved via optical bandpass filters and, additionally, the photodiodes were operated in reverse bias to lower the capacitance even more. The signal was gained up using a high-speed trans-impedance amplifier, which also enabled active cancellation of DC light signal, since without this high gain amplification is not possible. Active suppression of 1f signal was accomplished via a notch filter. Fast analogue to digital conversion was performed by a high resolution ADC and oversampling by a factor of at least 10 times of the 2f signal. Demodulation and Lock-in detection was followed by filtering performed in digital domain to avoid additional noise contribution from analogue circuits.

The 2f component of the plasma light signal consists of an amplitude and a phase. In addition to using the 2f amplitude, the phase also reveals important plasma properties related to collisional energy transfers occurring within each half cycle of excitation. At plasma excitation peaks, the acceleration of the ionic species is at a maximum leading to a high number of collisional energy transfer events. As the concentration of impurities added to the plasma changes, the energy transfer collisional events will also change leading to small shifts in the plasma bulk capacitance. This shift in plasma capacitance will appear as a "phase" shift in the 2f light signal with respect to the excitation 1f waveform as impurity concentration changes. An experimental example of this 2f light signal phase shift with impurity concentration is given in the experimental results section.

Experimental Results

Note that due to bremsstrahlung background radiation, an optical 2f signal may be present, even in the absence of any actively emitting species. Also, dependent on the gas mixture, the 2f optical signal may be due to direct photon emission by an excited gas species (e.g. argon in nitrogen), quenching or reduction of the emission of another species (e.g. nitrogen by oxygen or hydrogen) or enhancement of emission by the presence of another species (e.g. nitrogen by helium) or a combination of two or more of these processes. Enhancement of nitrogen emission at 337 nm by helium, for example, is due to the fact that the helium has a lower ionisation energy and hence can enhance the nitrogen excitation and therefore optical emission (Penning ionisation). Note that the relationship of 2f signal (such as the amplitude or integrated area) derived via whatever appropriate technique with gas concentration may be linear or non-linear, dependent on the gas mixture and concentration range. In the case of a non-linear signal, the output may be linearised from an empirical or theoretical fit, polynomial, other appropriate mathematical relationship or combination of two or more of these.

Figure 6:
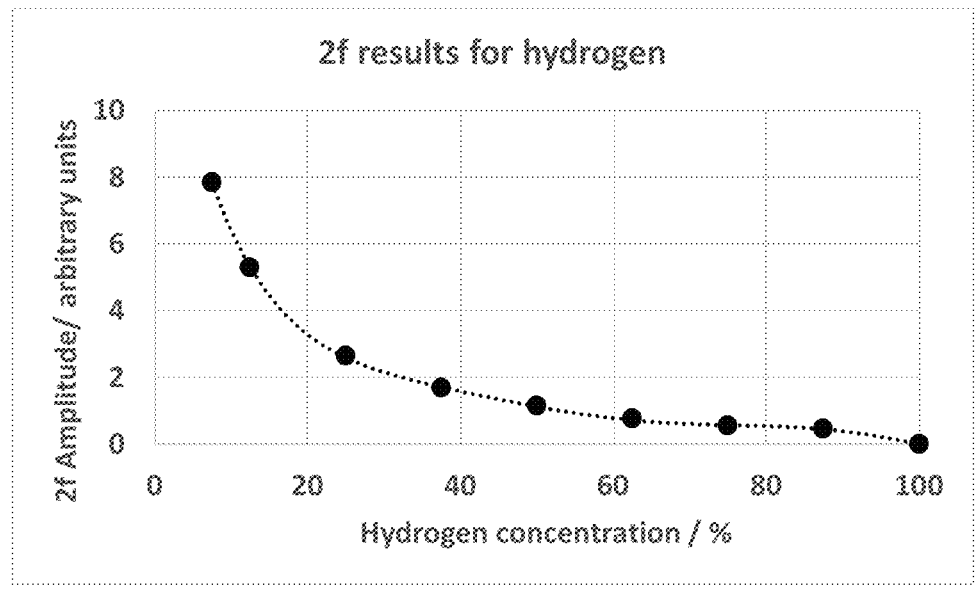
FIG. 6 is an illustration of the 2f signal amplitudes for hydrogen/nitrogen mixtures.

The performance of the 2f detection method was verified using new signal electronics and software. FIG. 6 shows the effect of hydrogen on nitrogen emission at 337 nm. The results are plotted of the 2f peak heights derived from oscilloscope traces vs the gas concentration. It can be seen that the hydrogen is quenching the nitrogen emission in a non-linear way.

Figure 7:
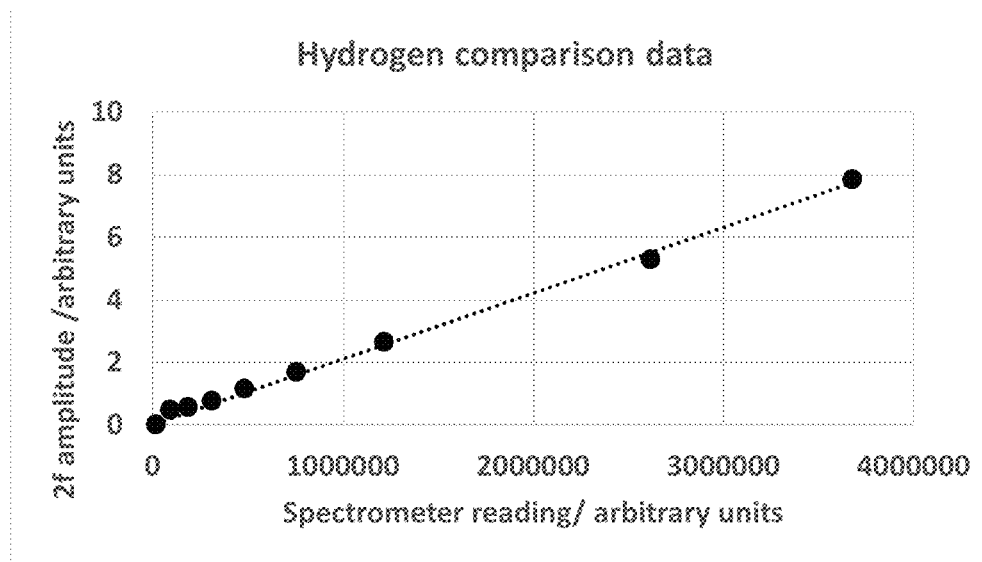
FIG. 7 is an illustration of the comparison between 2f amplitude and spectrometer amplitude results.

The correspondence of this 2f method to the conventional DC type measurement is clearly shown in FIG. 7, where the reference amplitude is derived from a spectrometer at 337 nm (using a diffraction grating and photodiode array) amplitude reading and shows an identical relationship of intensity with concentration by whichever method is employed, but with the 2f method providing performance improvements in the signal to noise.

Figure 8:
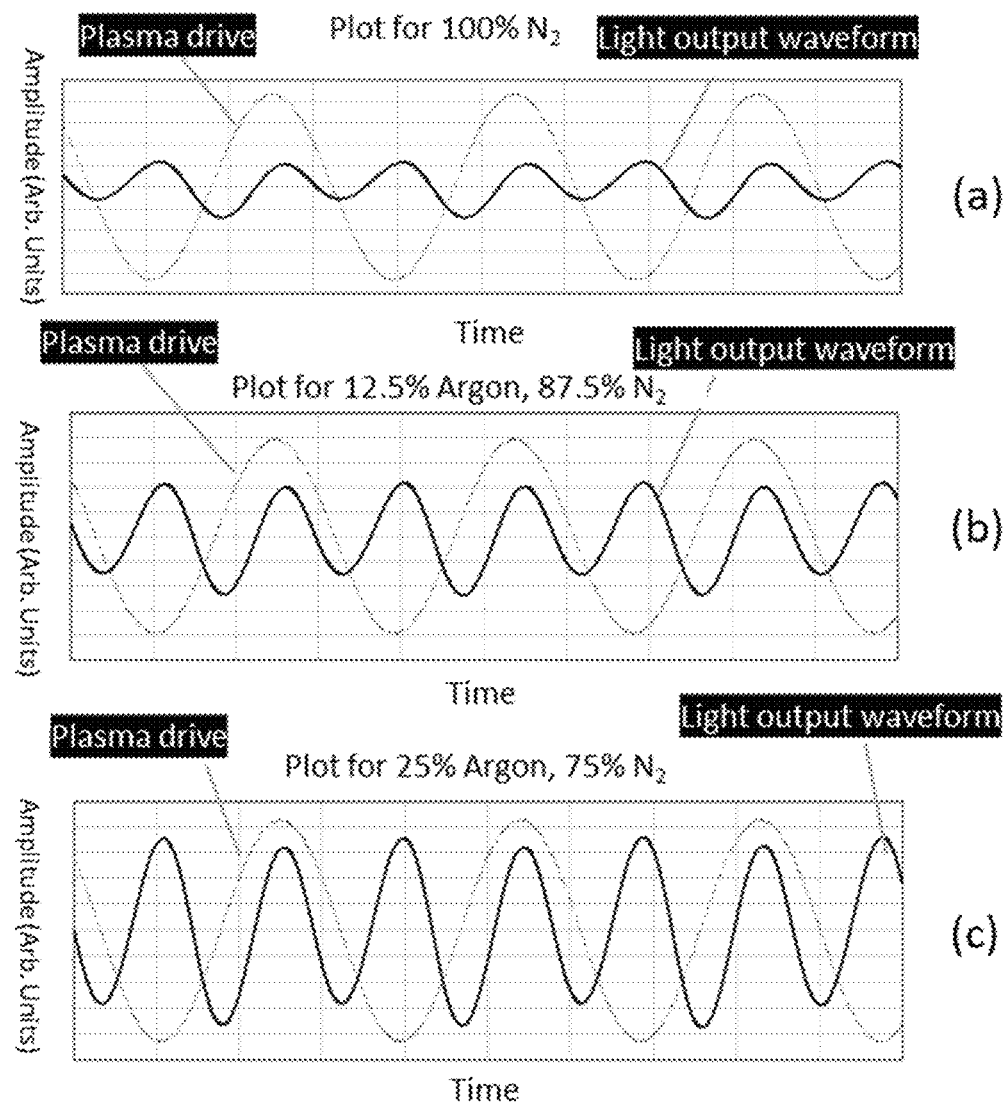
FIGS. 8(a), 8(b) and 8(c) are an illustration of signal waveforms for argon/nitrogen mixtures.
Figure 9:
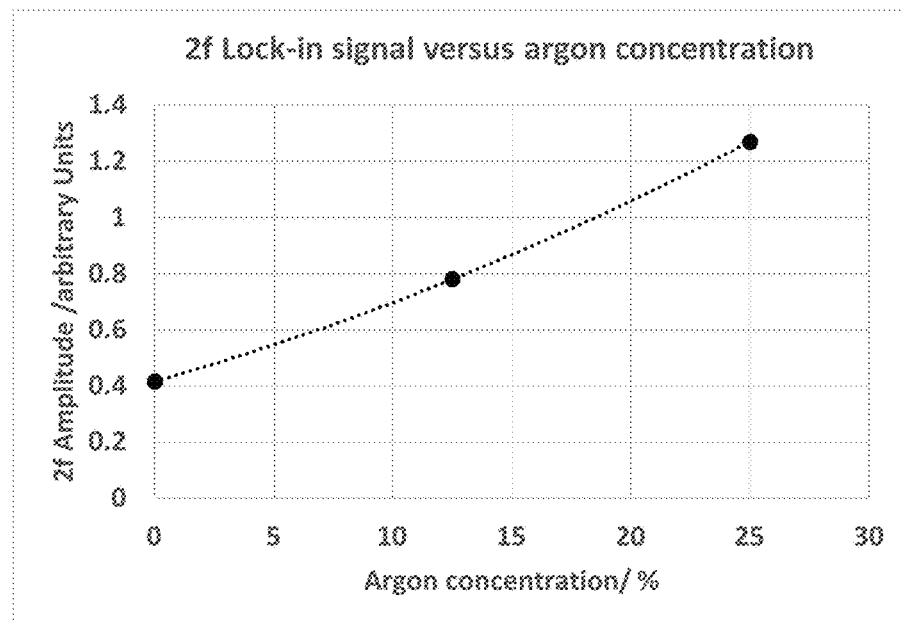
FIG. 9 is an illustration of the Lock-in amplitude for argon/nitrogen mixtures.

Experiments were also performed to illustrate the 2f detection method using 2f amplitude and Lock-in detection which are shown in FIGS. 8 (a) to (c). This was performed for argon in a background of nitrogen, with optical signal monitoring after an optical pass band filter centred at 780 nm with a silicon detector. Asymmetry of the 2f signal is a result of asymmetry in the electrodes and/or the detector position and orientation. The optical output maxima at 2f are clearly seen in all three graphs (a) to (c), as are the increasing amplitudes with argon concentration. FIG. 9 shows the relationship of the amplitude after 2f Lock-in detection with argon concentration and can be seen to be slightly non-linear over this concentration range.

Figure 10:
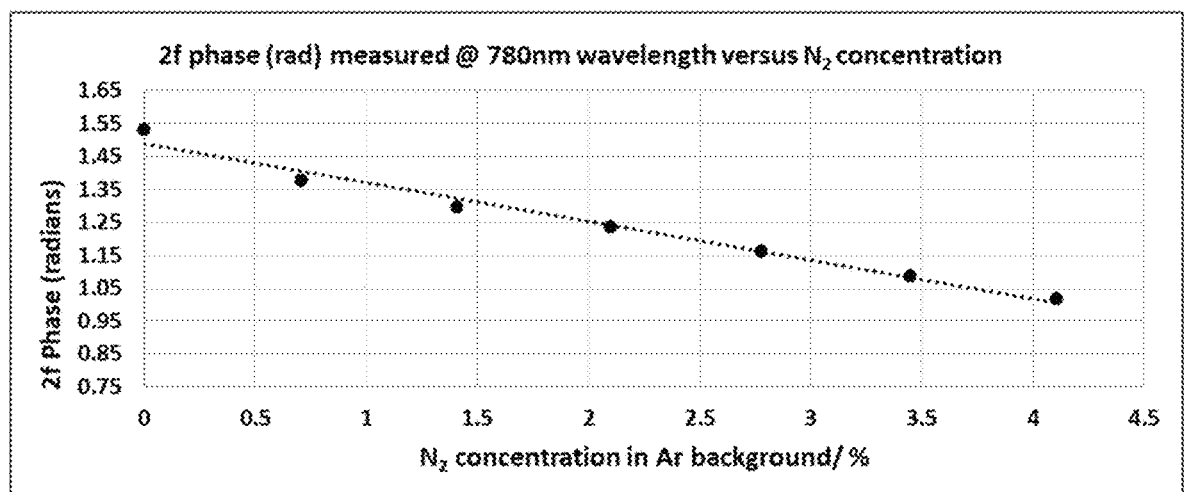
FIG. 10 is an illustration of the relationship of the phase difference between the 1f electrical excitation and 2f optical signal and impurity concentrations.

As described in the previous section, the phase difference between the 1f electrical excitation and 2f optical signal may also be linked with the impurity concentration and an example is shown in FIG. 10. FIG. 10 illustrates a decrease in phase angle with increasing nitrogen concentration.

The enhanced signal processing performance of the 2f signal is not limited to any particular opto-mechanical design, electronic drive or signal processing format and is generically applicable. In addition to the examples of FIGS. 1A and 1B, FIG. 3 and FIG. 4, two more examples are given in FIGS. 11A and 11B for schematics for different opto-mechanical and electrode arrangements. Different appropriate electronic drive and signal processing formats may be used as described above with either of these illustrations. These illustrations are shown with a single pair of electrodes and a single detector, which may be convenient for simplicity of design and manufacture, but similar 2f implementations with more than one pair of electrodes and/or with more than one detector may be envisaged, for example, with a second pair of electrodes being present orthogonal to the first pair and/or in series longitudinally and/or coaxially for simultaneous and/or consecutive electromagnetic excitations. These secondary electrodes may also be linked to secondary optical detection systems for multi-species detection.

Figure 11A:
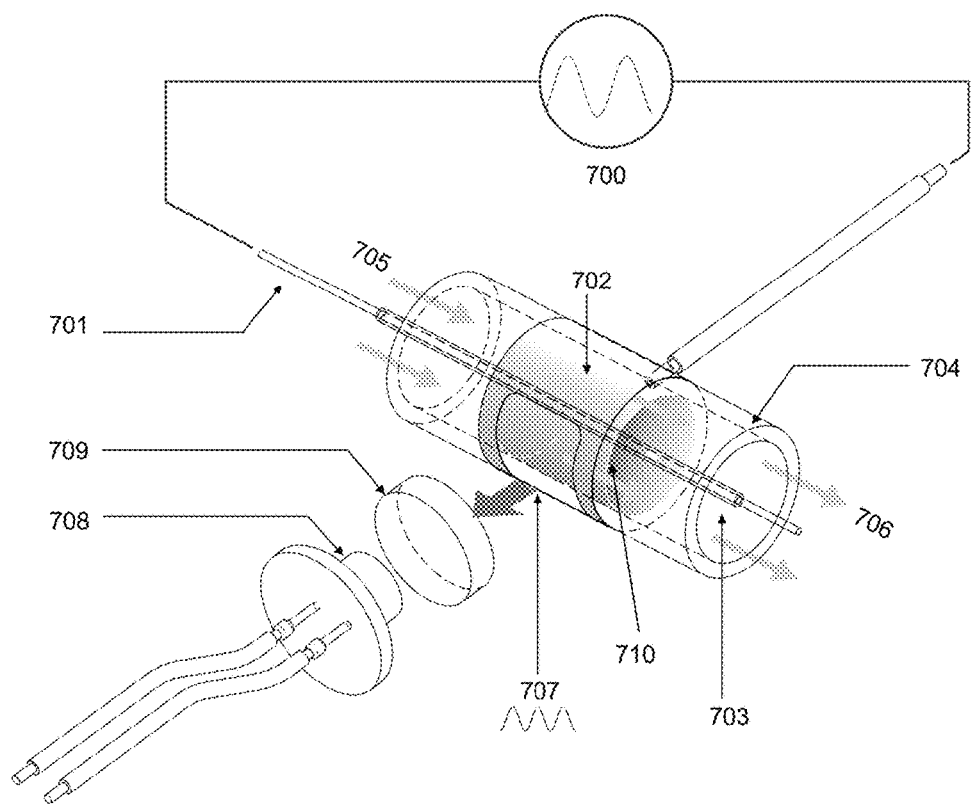
FIGS. 11A and 11B show illustrations of different optomechanical and electrode arrangements.

In FIG. 11A, the 1f plasma excitation drive circuit 700 used to create the electromagnetic field across the cell is electrically connected to an inner axial electrode 701 and an outer cylindrical electrode 702. The inner electrode 701 is shielded from the aggressive plasma environment by a close coupled, protective tubular sheath 703, which also acts as the inner dielectric barrier. In this illustration, the outer tube 704 and inner protective tube 703 may be made of quartz or other suitable dielectric materials for reasons discussed in the earlier sections. The sample gas is contained within the internal volume between the outer 704 and inner 703 tubes. The electrodes 701 and 702 may be bonded onto the dielectric for electrical, mechanical and chemical reasons. The gas inlet 705 and gas outlet 706 allow the passage of the gas to be analysed in and out of the cell. A window 707 in electrode 702 allows the emission of light from excited species at 2f to be detected by a suitable detector such as a silicon detector 708 after passing through a wavelength selective element 709, such as an optical bandpass filter. The location, size and shape of the plasma formed 710 will be determined by the design and materials of the cell. The optical signal detected can then be suitably processed such as by means illustrated in FIG. 4.

Figure 11B:
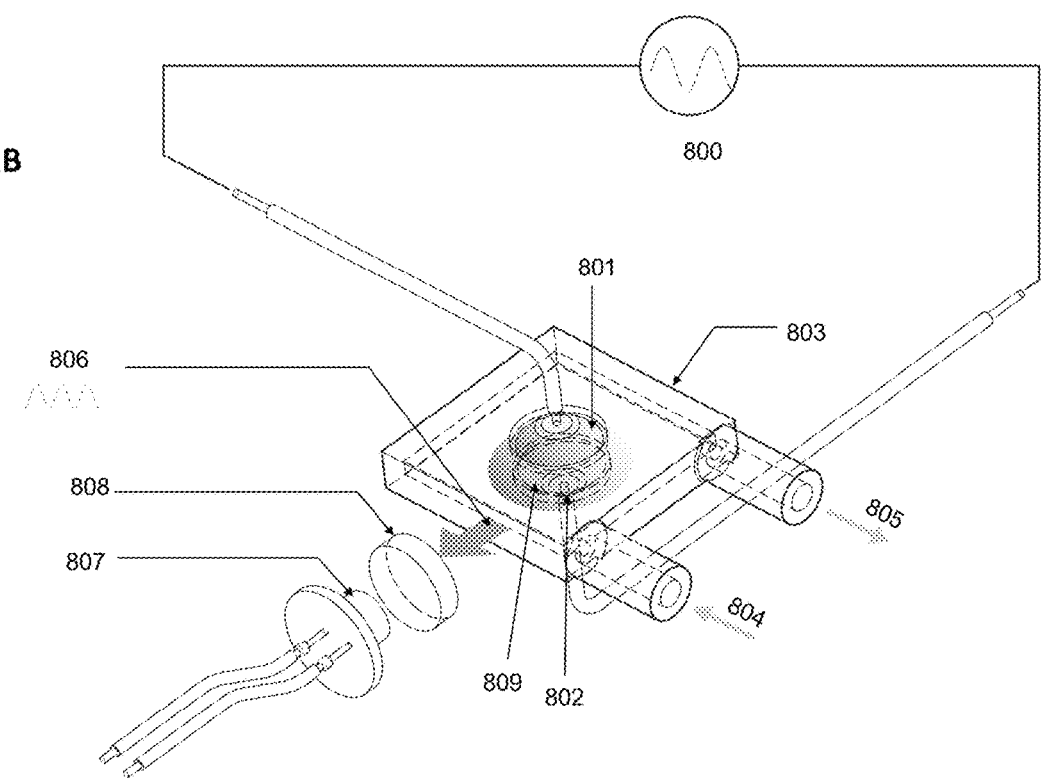

In FIG. 11B, the 1f plasma excitation drive circuit 800 used to create the electromagnetic field across the cell is electrically connected to a circular top electrode 801 and a circular base electrode 802. Both electrodes are shielded from the aggressive plasma environment by the dielectric barrier of the plasma cell 803, to which they are also adhesively bonded. In this illustration, the dielectric material of the cell 803 may be made of quartz or other suitable dielectric materials for reasons discussed in the earlier sections. The sample gas is contained within the internal volume of the cell 803. The gas inlet 804 and gas outlet 805 allow the passage of the gas to be analysed in and out of the cell 803. A window 806 in the cell 803 allows the emission of light from excited species at 2f to be detected by a suitable detector such as a silicon detector 807 after passing through a wavelength selective element, such as an optical bandpass filter 808. The location, size and shape of the plasma formed 809 will be determined by the design and materials of the cell. The optical signal detected can then be suitably processed such as by means illustrated in FIG. 4.

Figure 12:
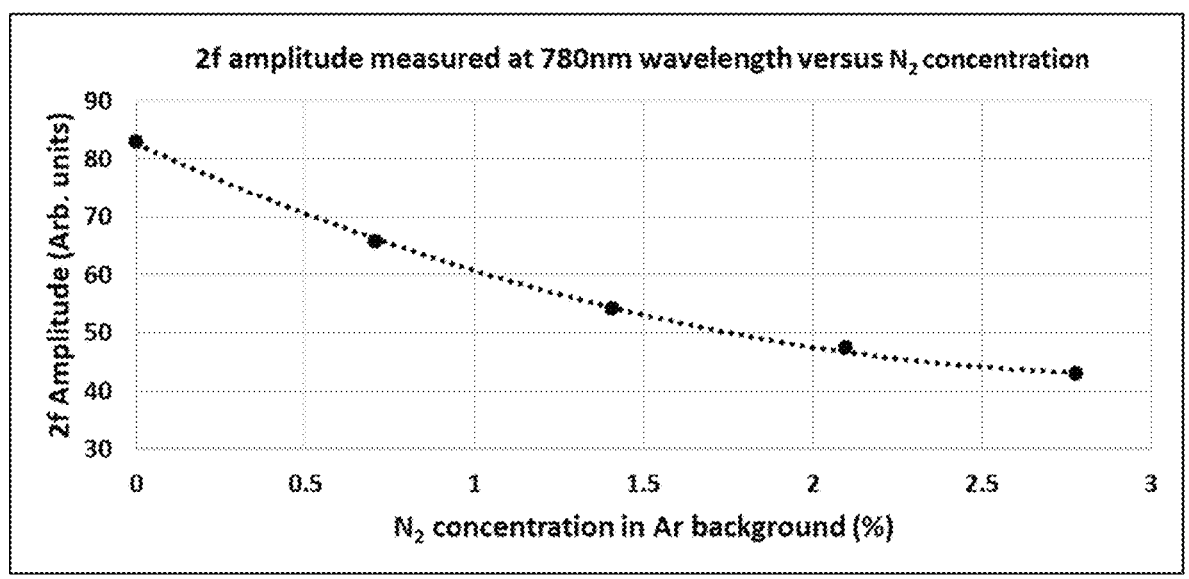
FIG. 12 is an illustration of results obtained using a conventional self-oscillating drive circuit and an optomechanical cell as shown in FIG. 11B.

The graph in FIG. 12 illustrates similar results are also obtained using a conventional self-oscillating drive circuit instead of the resonant current feedback control circuit that is illustrated in FIG. 4 and an optomechanical cell as shown schematically in FIG. 11B instead of the cell shown in FIG. 1A. Although the self-oscillating drive has a narrower functional range than the earlier resonant feedback examples, nevertheless, the relationship of the 2f signal amplitude with nitrogen concentration is clearly illustrated.

The invention claimed is:

1. A method comprising:
    generating one or more oscillating electromagnetic fields within a plasma cell to excite particles within the cell, to produce a glow discharge plasma in the plasma cell, and controlling the operating conditions for the plasma cell while flowing a gas mixture through the plasma cell to maintain glow discharge optical emissions from the plasma within a desired operating range; and
    monitoring one or more glow discharge optical emissions from the plasma in the plasma cell;
    wherein said monitoring of the optical emissions comprises measuring the optical emissions, or measuring a signal that correlates with the optical emissions, at twice the plasma excitation frequency; and
    processing the measured optical emissions or signal during each excitation cycle of the electromagnetic excitation, to determine the concentration of a gas within a gas mixture flowing through the plasma cell.

2. A method according to claim 1, wherein the monitoring comprises measuring the optical emissions or signal in real time using at least one optical detector.

3. A method according to claim 1, wherein an optical signal is collected after passing through the transmission band of at least one optical filter or by using at least one dispersive grating or other appropriate wavelength selection device.

4. A method according to claim 1, wherein processing the signal is completed in real time using digital signal processing.

5. A method according to claim 1, wherein a notch filter is used to narrow the frequency bandwidth of the optical emissions or signal and obtain separation in frequency from the excitation frequency.

6. A method according to claim 1, wherein processing the measured optical emissions or signal comprises one or more of the following: Lock-in detection, synchronous detection or frequency domain analysis.

7. A method according to claim 1, wherein measuring of the optical emissions or signal comprises measuring peak heights, peak areas or integrals of an optical signal or measuring the phase difference between an excitation signal having a first excitation frequency (1f) and a measured optical signal at twice the excitation frequency (2f).

8. A method according to claim 1, wherein post signal filtering is applied, the post signal filtering comprising a median filter and/or ensemble averaging and/or moving averaging.

9. A method according to claim 1, wherein a drive current for generating one or more oscillating electromagnetic fields has a sinusoidal drive waveform.

10. A method according to claim 1, wherein a drive current for generating one or more oscillating electromagnetic fields has a drive waveform which is a square wave, a saw tooth wave, a smooth non-sinusoidal function, or a combination of such waveforms.

11. A method according to claim 1, wherein a change in phase angle between an excitation signal waveform and a measured signal waveform is used to enhance determination of gas concentration and/or background gas composition.

12. A method according to claim 1, wherein the electromagnetic field across the plasma cell is an electric field generated by an alternating excitation voltage and said controlling is undertaken on an excitation cycle-by-excitation cycle basis.

13. A method according to claim 12 in which the electromagnetic field includes a first electric field and a second electric field each generated by an alternating excitation voltage.

14. A method according to claim 12 in which the electromagnetic field includes a combination of an electric field generated by an alternating excitation voltage with a magnetic field generated by an alternating excitation current in an electromagnet.

15. A method according to claim 1, wherein the electromagnetic field is a magnetic field generated by an alternating excitation current in an electromagnet and said controlling is undertaken on an excitation cycle-by-excitation cycle basis.

16. A method according to claim 15 in which the electromagnetic field includes a first magnetic field and a second magnetic field each generated by an alternating excitation current in an electromagnet.

17. A method according to claim 1, wherein the monitoring of the optical signal comprises measuring the amplitude of the signal that is measured at twice the plasma excitation frequency, and wherein said monitoring is used to determine the concentration of a gas within a gas mixture.

18. A method according to claim 17, wherein a measured change in signal amplitude with gas concentration is linearised from an empirical or theoretical fit, polynomial, other appropriate mathematical relationship or combination of two or more of these.

19. A method according to claim 1, wherein an amplitude, width, area or other feature of frequency signal components other than at twice the plasma excitation frequency is used to enhance determination of gas concentration and/or background gas composition.

20. A system comprising:
a plasma cell with an inlet and an outlet for flowing a gas mixture through the plasma cell;
an electromagnetic field generator for generating one or more oscillating electromagnetic fields within the plasma cell, to excite particles within the cell to produce a glow discharge plasma in the plasma cell;
a controller for controlling operating conditions for the plasma cell while flowing a gas mixture through the plasma cell to maintain glow discharge optical emissions from the plasma within a desired operating range; and
one or more optical detectors coupled to one or more measurement circuits configured to monitor glow discharge optical emissions from the plasma in the plasma cell, wherein said monitoring of the optical emissions comprises measuring the optical emissions, or measuring a signal that correlates with the optical emissions, at twice the plasma excitation frequency;
wherein the system comprises a signal processor configured to process the measured optical emissions or measured signal during each excitation cycle of the electromagnetic excitation, to determine the concentration of a gas within a gas mixture flowing through the plasma cell.

21. A system according to claim 20, wherein photodiodes are used to monitor the optical emissions, said photodiodes having intrinsically low capacitance and high shunt resistance and being used to monitor the optical emissions in the ultraviolet, visible or near infrared light range.

22. A system according to claim 21, wherein the photodiodes are reverse biased to reduce an intrinsic photodiode junction capacitance.

23. A system according to claim 20, wherein a signal collection is achieved after passing through the transmission band of an optical filter or by using a dispersive grating or other wavelength selection device.

24. A system according to claim 20, wherein the glow plasma is controlled by using a Royer transformer in a self-oscillating scheme to maintain a stable plasma, to enable a controlled glow plasma to be maintained over a narrow range of operating conditions.

25. A system according to claim 20, wherein secondary stabilisation electrodes are used to apply a transverse electric field and/or to provide electron-injection.

26. A system according to claim 20, wherein the electromagnetic field generator is a voltage generator and a stable glow discharge plasma is maintained in the plasma cell by applying an input signal from the voltage generator to at least two electrodes in the plasma cell to generate a voltage gradient between the electrodes, measuring an induced signal across the plasma cell using a meter, and using a comparator to compare the induced signal with a reference signal to obtain a difference signal; and wherein the controller determines a control signal which is then applied to the at least two electrodes in the plasma cell based on the obtained difference signal to achieve a desired voltage gradient for the excitation that is needed for a stable glow under resonance conditions.

27. A system according to claim 26, wherein the induced signal is a plasma current and the reference signal is a drive current waveform.

28. A system according to claim 26, wherein the electromagnetic field is generated by an alternating excitation voltage and said controlling is undertaken on a cycle-by-cycle basis for each excitation cycle.

29. A system according to claim 28, wherein the alternating excitation voltage is controlled to have a frequency within a predetermined resonant frequency band.

30. A system according to claim 26, wherein the electromagnetic field is generated between two or more electrodes within the plasma cell, and controlling the operating conditions comprises controlling the voltage gradient between the electrodes, to achieve a desired electrical current between the electrodes.

31. A system according to claim 26, wherein the controlling comprises adapting an excitation waveform, frequency, current and/or voltage.

32. A system according to claim 26, wherein the determining comprises comparing a measured voltage proportional to the plasma current with a reference voltage.

33. A system according to claim 26, which is responsive to changing operating conditions for the plasma cell to control each of a plurality of different operating conditions for the plasma cell.

34. A system according to claim 26, wherein the control of a plurality of operating conditions comprises high frequency adjustments to one or more electrical input parameters and/or low frequency adjustments to one or more physical configuration parameters.

35. A system according to claim 26, wherein a drive frequency is scanned or chirped across a defined frequency range either on a regular or variable basis and a plasma excitation frequency is actively adapted to coincide with the peak resonance related to a species mixture to be analysed or a phase locked loop circuit is used to indicate the change in phase or resonant frequency of a self-oscillating plasma system.

36. A system according to claim 26, wherein the flow rate is adapted with a feedback system to maintain the plasma current at a predetermined value.

37. A system according to claim 20, further comprising: means for transferring energy to gas molecules before the molecules enter the plasma cell.

38. A system according to claim 20, wherein a sample gas is maintained at a predetermined, controlled temperature prior to entry to the plasma cell.

39. A system according to claim 20, wherein the plasma cell is maintained at a predetermined, controlled temperature.

40. A system according to claim 20, wherein a flow rate of gas through the plasma cell is maintained at a predetermined, controlled flow rate.

41. A system according to claim 20, wherein one or more dopants are added to the sample gas prior to entry to the plasma cell.

42. A system according to claim 41, wherein a dopant is water.

43. A system according to claim 20, wherein the plasma cell is at or maintained at atmospheric pressure or higher than atmospheric pressure.

44. A system according to claim 20, wherein pressure in the plasma cell is adapted with a feedback system to maintain the plasma current at a predetermined value.

45. A system according to claim 20, wherein generating an electromagnetic field comprises generating a magnetic field within a plasma cell using an electromagnet.

46. A system according to claim 20, wherein the plasma cell has at least one optically transmissive element, transparent to the wavelength range of the light of interest.

47. A system according to claim 46, wherein the optically transmissive element is photostable and non-luminescing and includes one or more optically transmissive elements selected from the group comprising: windows, lenses, diffraction gratings, optical filters and spectrometers.

48. A system according to claim 20, wherein optical fibres are used to transfer the optical output to a non-line-of-sight destination and/or from a hot region containing the plasma cell to a cooler region where the electronics can operate within their operational ambient temperature limits and/or allowing the siting of the detector and/or signal processing electronics at a distance away from the plasma cell and the high associated electromagnetic fields.

49. A system according to claim 20, comprising more than one pair of electrodes, including a first pair and one or more secondary pairs, wherein the secondary electrode pairs are orthogonal to the first pair and/or in series longitudinally and/or coaxially for simultaneous and/or consecutive electromagnetic excitations.

* * * * *